United States Patent [19]

Suzuki et al.

[11] Patent Number: 5,300,811
[45] Date of Patent: Apr. 5, 1994

[54] INTEGRATED CIRCUIT DEVICE AND MICROPROCESSOR CONSTITUTED THEREBY

[75] Inventors: Katsunori Suzuki; Toyohiko Yoshida, both of Itami, Japan

[73] Assignee: Mitsubishi Denki Kabushiki Kaisha, Tokyo, Japan

[21] Appl. No.: 644,808

[22] Filed: Jan. 22, 1991

[30] Foreign Application Priority Data

Jan. 22, 1990 [JP] Japan .................................. 2-12831

[51] Int. Cl.[5] ............................................ H01L 23/02
[52] U.S. Cl. ................................... 257/691; 257/693; 257/700
[58] Field of Search .................. 357/74, 72, 43, 69, 357/41; 257/691, 693, 700

[56] References Cited

U.S. PATENT DOCUMENTS

| | | | |
|---|---|---|---|
| 4,412,237 | 10/1983 | Masumura et al. | 357/41 |
| 4,879,588 | 11/1989 | Ohtsuka et al. | 257/664 |
| 4,984,202 | 1/1991 | Kawahara et al. | 357/43 |
| 4,985,748 | 1/1991 | Belanger, Jr. | 357/69 |
| 4,991,001 | 2/1991 | Takubo et al. | 357/70 |

OTHER PUBLICATIONS

"MC68020 32-Bit Microprocessor User's Manual," 1984, Motorola, Inc.

*Primary Examiner*—Rolf Hille
*Assistant Examiner*—Roy Potter
*Attorney, Agent, or Firm*—Townsend and Townsend Khourie and Crew

[57] ABSTRACT

An integrated circuit device in which by connecting signal pads of a semiconductor chip to either a power potential lead or a ground potential lead of a package at assembly time, either of plural initial states set in the semiconductor chip in advance is set, and a microprocessor constituted by above-mentioned integrated circuit device in which a signal for setting an initial value of a data bus width control resister at resetting timing is inputted from a data size designating pad and set, and a register for controlling an effective data bus width is provided, and by changing the set value of the data bus width register by the instruction, an effective bit width of the data bus is changed to the value different from the initial set value, thereby the instruction under pre-processing as the pipeline processing is cleared, and the instruction right after is fetched at the effective bus width newly set for execution.

20 Claims, 18 Drawing Sheets

Fig. 3
Prior Art $\overline{\text{DSACK}}$="LL": 4 BYTE

| | SIZ0 | SIZ1 | A0 | A1 | 31 | 24 | 16 | 8 | 0 |
|---|---|---|---|---|---|---|---|---|---|
| 1 BYTE | 1 | 0 | 0 | 0 | ▨ | | | | |
| | 1 | 0 | 1 | 0 | | ▨ | | | |
| | 1 | 0 | 0 | 1 | | | ▨ | | |
| | 1 | 0 | 1 | 1 | | | | ▨ | |
| 2 BYTE | 0 | 1 | 0 | 0 | ▨ | ▨ | | | |
| | 0 | 1 | 1 | 0 | | ▨ | ▨ | | |
| | 0 | 1 | 0 | 1 | | | ▨ | ▨ | |
| | 0 | 1 | 1 | 1 | | | | ▨ | |
| 3 BYTE | 1 | 1 | 0 | 0 | ▨ | ▨ | ▨ | | |
| | 1 | 1 | 1 | 0 | | ▨ | ▨ | ▨ | |
| | 1 | 1 | 0 | 1 | | | ▨ | ▨ | |
| | 1 | 1 | 1 | 1 | | | | ▨ | |
| 4 BYTE | 0 | 0 | 0 | 0 | ▨ | ▨ | ▨ | ▨ | |
| | 0 | 0 | 1 | 0 | | ▨ | ▨ | ▨ | |
| | 0 | 0 | 0 | 1 | | | ▨ | ▨ | |
| | 0 | 0 | 1 | 1 | | | | ▨ | |

(SERIAL BIT NUMBER)

0　　　　　7 8　　　　　1516　　　　　2324　　　　　31

(BIT NUMBER IN EACH BYTE)

0　　　　　7 0　　　　　7 0　　　　　7 0　　　　　7

N　　　　　N+1　　　　　N+2　　　　　N+3

(ADDRESS)

←LOW ADDRESS　　　　　HIGH ADDRESS→
←MSB SIDE　　　　　　　　　LSB SIDE→

←—DIRECTION OF READ INSTRUCTION—→

Fig. 9

| INPUT SIGNAL TO DATA SIZE SPECIFYING TERMINAL ||  DATA SIZE OF ROM 14 |
|---|---|---|
| 7 | 8 | |
| 1 | 1 | 32 BIT |
| 1 | 0 | 16 BIT |
| 0 | 1 | 8 BIT |
| 0 | 0 | reserve |

Fig. 16

| EXTERNAL INTERRUPTION SPECIFYING TERMINAL IR0:2 | | | INTERRUPTION LEVEL |
|---|---|---|---|
| 8 a | 8 b | 8 c | |
| 0 | 0 | 0 | LEVEL 0 (HIGH PRIORITY INTERRUPTION) |
| 0 | 0 | 1 | LEVEL 1 |
| 0 | 1 | 0 | LEVEL 2 |
| 0 | 1 | 1 | LEVEL 3 |
| 1 | 0 | 0 | LEVEL 4 |
| 1 | 0 | 1 | LEVEL 5 |
| 1 | 1 | 0 | LEVEL 6 (LOW PRIORITY INTERRUPTION) |
| 1 | 1 | 1 | reserve |

Fig. 17

| INTERRUPTION MASK LEVEL SPECIFYING FIELD IMASK 9a | CONNECTION OF INTERRUPTION MASK LEVEL SPECIFYING TERMINAL | | | | MASKED INTERRUPTION LEVEL |
|---|---|---|---|---|---|
| | 7a | 7b | 7c | 7d | |
| 0 0 0 0 | Gnd | Gnd | Gnd | Gnd | INTERRUPTION TO LEVEL 1 IS MASKED (ONLY LEVEL 0 IS ACCEPTED) |
| 0 0 0 1 | Gnd | Gnd | Gnd | Vcc | INTERRUPTION TO LEVEL 1 IS MASKED (ONLY LEVEL 0 IS ACCEPTED) |
| 0 0 1 0 | Gnd | Gnd | Vcc | Gnd | INTERRUPTION TO LEVEL 2 ARE MASKED (LEVEL 0 AND 1 ARE ACCEPTED) |
| . . . | . . . | . . . | . . . | . . . | . . . |
| 0 1 1 0 | Gnd | Vcc | Vcc | Gnd | INTERRUPTION TO LEVEL 6 ARE MASKED |
| 0 1 1 1 | Gnd | Vcc | Vcc | Vcc | reserve |
| . . . | . . . | . . . | . . . | . . . | . . . |
| 1 1 1 1 | Vcc | Vcc | Vcc | Vcc | NOT MASK |

( Vcc: SOURCE VOLTAGE, Gnd: GROUND VOLTAGE )

INTEGRATED CIRCUIT DEVICE AND MICROPROCESSOR CONSTITUTED THEREBY

BACKGROUND OF THE INVENTION

1. Field of the Invention

The present invention relates to an integrated circuit device wherein an initial state can be set at assembly time and the initial state is set by bonding wires, furthermore, it relates to a microprocessor capable of settling an effective bit width of a data bus and changing the effective data-bus width by instructions.

2. Description of Related Art

Conventionally, in a system using a microprocessor, a method of using external pins for programming by hardware to set an internal state of the microprocessor without using software is used.

For example, in the microprocessor which accesses the external data bus to which peripheral devices of different data bus sizes are connected, a width of data bus must be switched to 8 bits, 16 bits, 32 bits etc. by reasons of a memory or I/O sides to access the external devices. As a means for switching the data bus width, a method called a dynamic bus sizing is known.

In the method of dynamic bus sizing, a signal specifying how many bytes is the memory or I/O device data width which is now addressed, is returned to the microprocessor from the memory side when returning acknowledge to the data strobe at read/write of the memory.

As an example of the conventional microprocessor adopting the method of dynamic bus sizing, a microprocessor MC68020 by Motorola Corp. is known.

In the following the microprocessor MC68020 by Motorola Corp. is described as the prior art.

FIG. 1 is a schematic view showing a configuration of a bus interface of the microprocessor MC68020.

The bus interface of the microprocessor MC68020 comprises, an address bus 51 having the 32-bit width of A0 to A31 bit, a data bus 52 having the 32-bit width of D0 to D31 bit, a sequence control line and signal lines for interruption, arbitration control and so on.

The bus interface of the microprocessor MC68020 is capable of sending and receiving data by adjusting the bus width to the bus ports of 8-bit, 16-bit and 32-bit widths. However, for the purpose of dynamically interfacing with the bus having the bit width which differs in each bus cycle, informing the data size mutually with the outside by two size pins (SIZ1, SIZ0) and 2 sized data acknowledge pins (DSACK1, DSACK0).

A bit width of the operand requested by the microprocessor MC68020 is informed to all of the devices connected to the bus, by using the size pins (SIZ1, SIZ0).

Here, the 2-bit SIZ signal represents,

SIZ = 00 : 4 byte transfer
    = 01 : 1-byte transfer
    = 10 : 2-byte transfer
    = 11 : 3-byte transfer The memory, when addressed adequately, informs the bit width of the operand transferred actually from the address to the microprocessor MC68020 by using the sized data acknowledge pins (DSACK1, DSACK0).

Here, the 2-bit DSACK signal represents,

DSACK = HH : no data transfer
      = HL : 1-byte bus
      = LH : 2-byte bus
      = LL : 4-byte bus Relationship between the DSACK signal and SIZ signal is shown in the following.

i) The address (A0 to A31) of the memory which is requested by the microprocessor MC68020 to be transferred and the SIZ signal of the number of requested bytes are outputted, and simultaneously, a direction of transfer is indicated by the read/write (R/W) signal.

ii) Next, an address strobe signal $\overline{AS}$ is turned to the low activity to indicate that various signals for data transfer are stabilized.

iii) A memory block and I/O block specified by the address and function code perform the following works.

It is decoded by contents of the addresses A1, A0 that which memory is to be accessed, and it is set by the SIZ signal that how many bytes are to be accessed.

In the case of 2-byte memory width ($\overline{DSACK}$=LH), when the SIZ signal indicates one byte, depending on the address A0 which is "1" or "0" (even address or odd address), it is necessary to respond to address which is only for the high order byte or only for the low order byte. In this case, control of offset in memory words when accessing is classified into eight kinds as shown in a schematic view of FIG. 2. At this time, the $\overline{DSACK}$ signal is returned to the microprocessor in 2 bytes in any case.

When the 4-byte memory width is indicated ($\overline{DSACK}$=LL), though fairly complicated control is necessary on the memory side, its state is shown in a schematic view of FIG. 3.

As shown in FIG. 3, in all cases, the off-set in the memory words is decided by the address signals A0, A1, and from the off-set position decided, how many bytes are to be actually accessed by the SIZ signal must be decided.

A decoding function of the size signals SIZ1, SIZ0 and the address signals A0, A1 must be, basically, included in each memory block and I/O block.

Details of the method of dynamic bus sizing of the microprocessor MC68020 is described in page number 5-2 of MOTOROLA "MC68020 32-Bit Microprocessor User's Manual".

As the conventional microprocessor is constructed as aforementioned, external pins for outputting the signal indicating the data width of operand request from the microprocessor to the peripheral devices, and external pins for receiving the signal indicating the operand width transferred from the peripheral devices to the microprocessor are necessary.

Furthermore, external circuits for decoding relationship between the signal indicating the data width of operand request and the address are required respectively on each memory block and I/O block.

SUMMARY OF THE INVENTION

The present invention has been devised to solve the problems involved in the conventional microprocessor as above-mentioned, therefore, it is an object thereof to provide a microprocessor capable of easily accessing various devices having different bus sizes, without increasing external pins and providing exterior circuits for decoding relationship between the signal indicating a data width of the operand request and the address on the respective peripheral devices, and an integrated circuit device for that purpose.

The integrated circuit device according to the present invention has signal pads into which a signal for allowing a semiconductor chip to take either of plural initial states is inputted, whereby either of the plural initial states set in the semiconductor chip in advance is selected and set, by connecting the signal pads of the semiconductor chip to either a power potential lead or a ground potential lead of a package at assembly time.

Since the microprocessor according to the present invention is constituted by the aforementioned semiconductor chip, either of the plural initial states is programmed by connecting the signal pads at assembly time.

Moreover, the microprocessor of the present invention includes a signal pad capable of setting an initial value in data bus width control value storing means (register), which controls an effective data bus width by connecting the signal pad for specifying the data size to either of the power potential or the ground potential at assembly time. Therefore, in the microprocessor according to the present invention, at resetting, a signal setting the initial value of the data bus width control value storing means (resister) is inputted from the data size specifying pad and set.

Meanwhile, in the microprocessor of the present invention, data bus width control value storing means for controlling the effective data bus width is provided, and by changing a set value of the data bus width control value storing means (register) by the instruction, an effective bit width of the data bus is changed to a value different from the initial set value. Therefore, in the microprocessor according to the present invention, by executing the instruction which chances the data bus width, the instruction under pre-processing as the pipeline processing is cleared, and the instruction right after is fetched at the effective bus width newly set for execution.

The above and further objects and features of the invention will more fully be apparent from the following detailed description with accompanying drawings.

BRIEF DESCRIPTION OF THE DRAWINGS

FIG. 3 is a schematic view showing an access classification, when a data width in a microprocessor MC68020 by Motorola Corp. is 4 bytes, FIG. 9 is a view showing relationship between input signals to data size specifying terminals of a microprocessor of the present invention and data sizes of an external ROM, FIG. 16 is a view showing relationship between input signals to external interruption specifying terminals and interruption levels of a microprocessor of the present invention, FIG. 17 is a view showing relationship between contents of an interruption mask level specifying field and input signals to interruption mask level specifying terminals of a microprocessor of the present invention.

DESCRIPTION OF THE PREFERRED EMBODIMENTS

In the following, the present invention will be described in reference to the drawings showing its embodiments.

Figure 1:
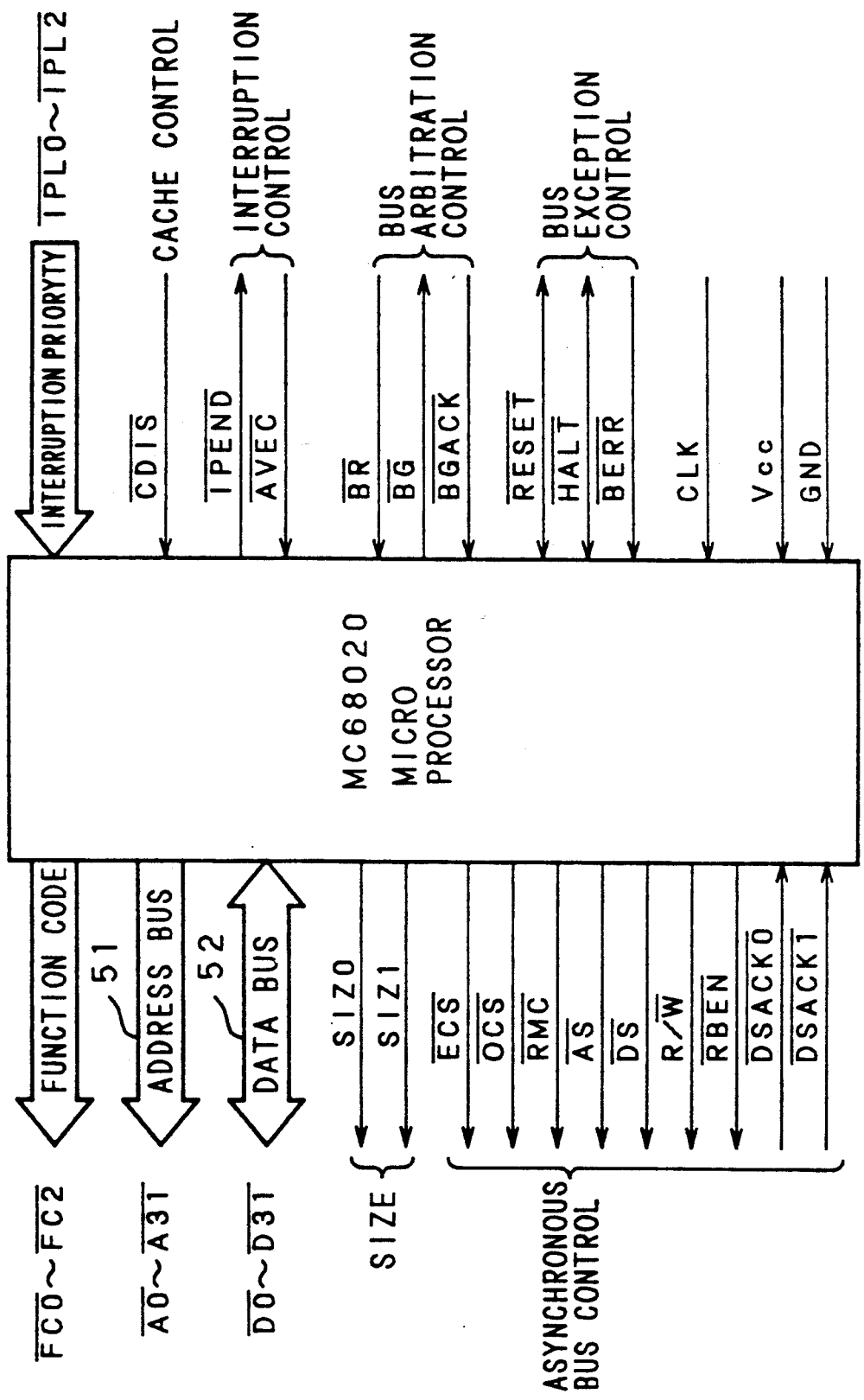
FIG. 1 is a schematic view showing a configuration of bus interface of a microprocessor MC68020 by Motorola Corp. as a prior art.
Figure 2:
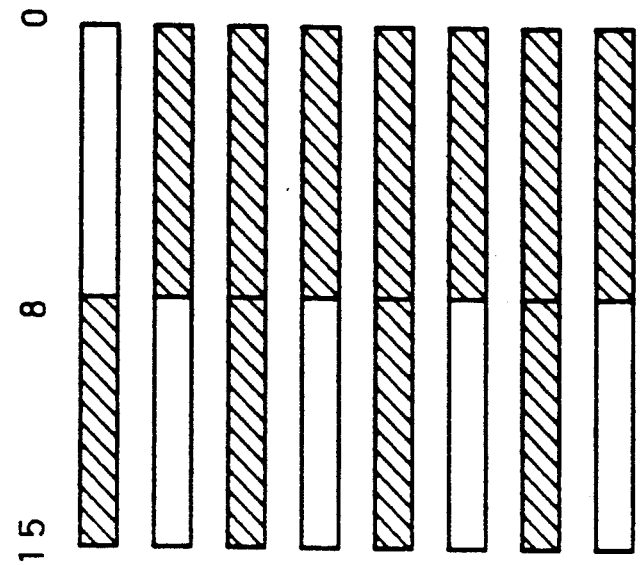
FIG. 2 is a schematic view showing an access classification, when a data width in a microprocessor MC68020 by Motorola Corp. is 2 bytes.
Figure 4:
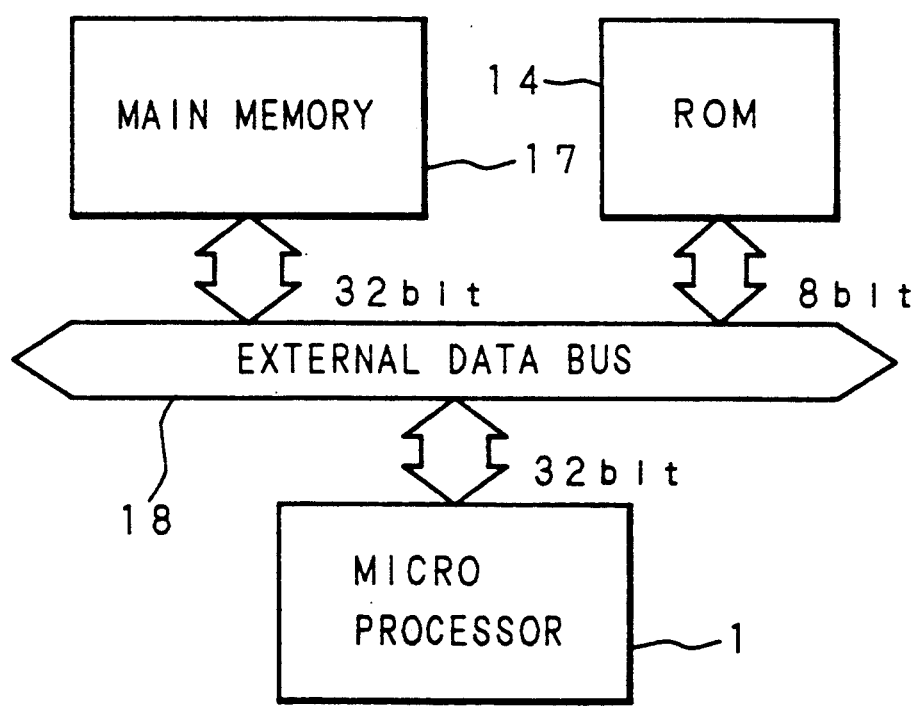
FIG. 4 is a block diagram showing a connecting state of a data bus of a system using a microprocessor of the present invention.

FIG. 4 is a block diagram showing an outline of the connecting state of a data bus of a system using a microprocessor of the present invention.

In FIG. 4, reference numeral 1 designates a microprocessor, 14 designates a ROM, 17 designates a main memory and 18 designates an external bus.

The microprocessor 1 is constituted by a semiconductor chip 1c sealed inside a package 3 as to be described later (refer to FIG. 11), and has a data size of 32 bits. The main memory 17 also has a data size of 32 bits.

While, the ROM 14 which stores information such as a program for initializing a system at booting, has a data size of 8 bits different from the microprocessor 1 and the main memory 17.

In the embodiment, the microprocessor 1 is constituted as stated below.

(1) "Instruction Format of the Microprocessor of the present Invention"

An instruction of a microprocessor of the present invention is formed on a 16-bit unit basis, being variable in length. No instruction with an odd number of bytes is used herein.

The microprocessor of the present invention has an instruction format system specifically devised for the purpose of writing highly frequent instructions in a short format. For example, as to a two-operand instruction, two formats are provided; a general format which has basically a configuration of "four bytes+extension part(s)" and allows the utilization of all addressing modes and a short format allowing only the use of a highly frequent instruction and an addressing mode.

The meanings of symbols appearing in the instruction format of the microprocessor of the present invention are as follows:

- - : Field wherein operation code is put.
- #: Field wherein literal or immediate is put.
- Ea : Field for generating an operand in a general type 8-bit addressing mode.
- Sh : Field for specifying an operand in a short type 6-bit addressing mode.
- Rn : Field for specifying an operand in a register by the register number.

Figure 5:
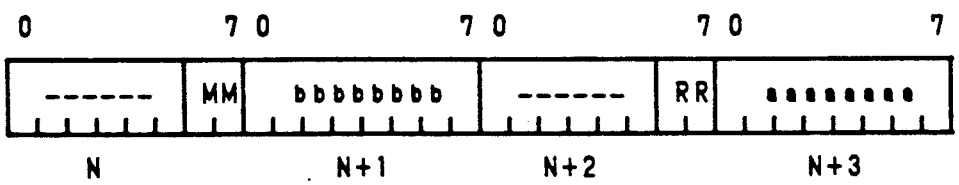
FIG. 5 is a schematic view showing an instruction format of a microprocessor of the present invention.

In the format, as shown in FIG. 5, the right side is the LSB side and is high address. The instruction format can be discriminated only after an address N and an address N+1 are checked. As described above, this is because of a premise that the instruction is fetched and decoded on a 16-bit (2-byte) unit basis without fail.

In the microprocessor of the present invention, in the case with any format, the extension part of Ea or Sh of each operand is sure to be positioned immediately after a half word comprising the basic part of that Ea or Sh. This takes precedence over the immediate data specified implicitly by the instruction or the extension part of the instruction. Accordingly, as to an instruction of four or more bytes, there are cases where the operation code of the instruction is divided by the extension part of Ea.

(2) "Configuration of Function Block"

Figure 6:
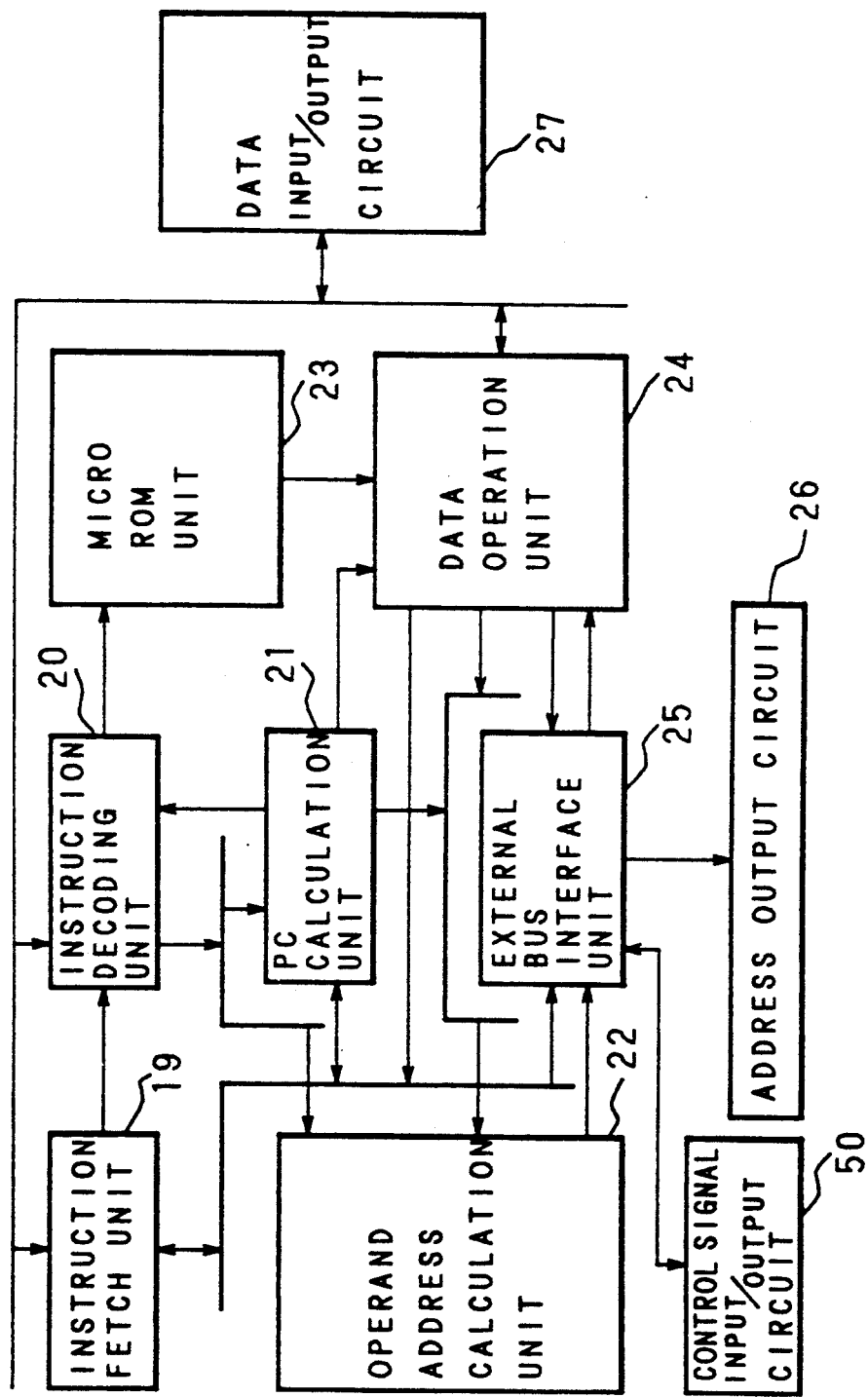
FIG. 6 is a block diagram showing a functional configuration of a microprocessor of the present invention.

FIG. 6 is a block diagram showing a configuration of the microprocessor of the present invention.

The interior of the microprocessor of the present invention is functionally divided roughly into an instruction fetch unit 10, an instruction decoding unit 20, a PC calculation unit 21, an operand address calculation unit 22, a micro ROM unit 23, a data operation unit 24 and an external bus interface unit 25.

Figure 8:
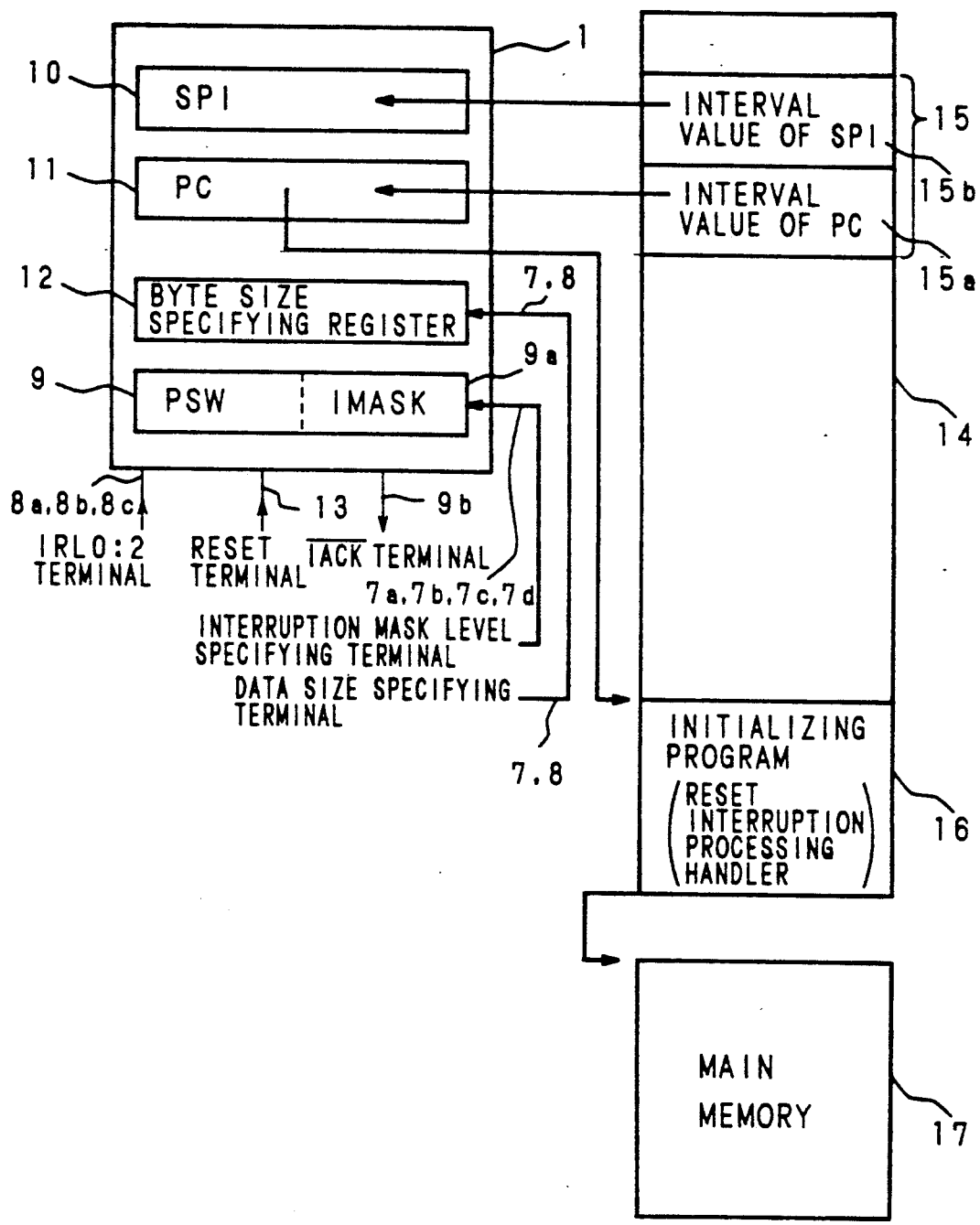
FIG. 8 is a schematic view for explaining the operation at booting of a microprocessor of the present invention.

In FIG. 8, in addition to the above-described units, an address output circuit 26 for outputting address to the exterior of a CPU, a data input/output circuit 27 for inputting and outputting data from and to the exterior of the CPU, and a control signal input/output circuit 50 are shown being separated from the other function block units.

(2.1) "Instruction Fetch Unit"

The instruction fetch unit 19 which comprises a branch buffer, an instruction queue and a controlling unit thereof, determines the address of a instruction to be fetched next and fetches the instruction from the branch buffer or a memory outside the CPU. It also performs instruction registering to the branch buffer.

The branch buffer is small-scaled, therefore operating as a selective cache.

The address of an instruction to be fetched next is calculated by a dedicated counter as the address of the instruction to be inputted to an instruction queue (not shown). In the case where a branch or jump is generated, an address of a new instruction is transferred from the PC calculation unit 21 or the data operation unit 24.

In the case where an instruction is fetched from a memory outside the CPU, the address of the instruction to be fetched is outputted from the address output circuit 26 to the outside of the CPU through the external bus interface unit 25, and an instruction code is fetched from the data input/output circuit 27. At this time, control signals for memory access to the outside of the CPU are inputted and outputted through the control signal input/output circuit 50.

Then, among the instruction codes in buffering, the instruction code to be decoded next is outputted to the instruction decoding unit 20.

(2.2) "Instruction Decoding Unit"

In the instruction decoding unit 20, basically an instruction code is decoded on a 16-bit (half word) basis. The instruction decoding unit 20 comprises a FHw decoder for decoding an operation code included in the first half word, a NFHW (not first half word) decoder for decoding an operation code including in the second and the third half words, and an addressing mode decoder for decoding an addressing mode.

The instruction decoding unit 20 also includes a second decoder for calculating entry addresses of the micro ROM by more decoding the outputs of the FHW decoder or NFHW decoder, a branch prediction mechanism for predicting branching of a conditional branch instruction, and an address calculation conflict check unit for checking pipeline conflict at an operand address calculation.

The instruction decoding unit 20 decodes the instruction code being inputted from the instruction fetch unit 19 by 0 bytes through 6 bytes per two clocks.

Among the results of decoding, information on operation in the data operation unit 24 is outputted to the micro ROM unit 23, information on operand address calculation is outputted to the operand address calculation unit 22, and information on PC calculation is outputted to the PC calculation unit 21, respectively.

(2.3) "Micro ROM Unit"

The micro ROM unit 23 comprises a micro ROM for storing microprograms which mainly controls the data operation unit 24, a micro sequencer, and a micro instruction decoder.

A micro instruction is read out from the micro ROM once per two clocks. The micro sequencer accepts processings of exception, interruption and trap (these three are generally called EIT) in a hardware manner in addition to the sequential processings shown by the microprograms. Also, the micro ROM unit 23 manages a store buffer.

To the micro ROM unit 23, there are inputted flag information generated by interruption independent of the instruction code or by the result of operation execution, and output of an instruction decoding unit 20 such as output of a second stage decoder.

Output of the micro decoder is mainly given to the data operation unit 24, but some information such as information of stopping other preceding process due to execution of a jump instruction is outputted also to other blocks.

(2.4) "Operand Address Calculation Unit"

The operand address calculation unit 22 is controlled in a hardwired manner by information on operand address calculation outputted from the addressing mode decoder of the instruction decoding unit 20 or the like. In this operand address calculation unit 22, substantially all processing on operand address calculations is performed. This unit 22 checks whether or not the address of memory access for memory indirect addressing and the operand address can be within an I/O area mapped in the memory.

The result of address calculation is sent to the external bus interface unit 25. The values of the general-purpose register and the program counter required for address calculation are inputted from the data operation unit 24.

In performing the memory indirect addressing, the memory address to be referred is outputted from the address output circuit 26 to the outside of the CPU through the external bus interface unit 25, and the indirect address value inputted from the data input/output unit 29 is fetched intact through the instruction decoding unit 20.

(2.5) "PC Calculation Unit"

The PC calculation unit 21 is controlled in a hardwired manner using information on PC calculation outputted from the instruction decoding unit 20. The PC calculation unit 21 calculates the PC value of an instruction.

The microprocessor of the present invention has a variable-length instruction set, and the length of that instruction can be found only after the instruction is decoded. For this reason, the PC calculation unit 21 generates the PC value of the next instruction by adding the length of the instruction outputted from the instruction decoding unit 20 to the PC value of the instruction in decoding.

In the case where the instruction decoding unit 20 decodes a branch instruction and indicates a branch in the decoding stage, the PC value of a branch destination instruction is calculated by adding a branch displacement in place of the instruction length to the PC value of the branch instruction. In the microprocessor of the present invention, performing a branch in the instruction decoding stage in response to the branch instruction is called prebranch.

The result of calculation in the PC calculation unit 21 is outputted as the PC value of each instruction together with the result of decoding of the instruction, and in addition, is outputted to the instruction fetch unit 19 as the address of the instruction to be decoded next at pre-branch. Also, it is used for the address for branch prediction of the instruction to be decoded next in the instruction decoding unit 20.

(2.6) "Data Operation Unit"

The data operation unit 21 is controlled by a microprogram, and executes the operation required for realizing the function of each instruction by means of registers and an arithmetic unit according to outputted information of the micro ROM unit 23.

In the case where the address calculated in the operand address calculation unit 22 is obtained by passing it through the external bus interface unit 25 to the data operation unit 24.

In the case where the operand fetched by abovementioned address is obtained to the data operation unit 24 from the data input/output circuit 27.

Arithmetic units include an ALU, a barrel shifter, a priority encoder, a counter, a shift register. The register file and main arithmetic unit are connected through three buses. One microinstruction which directs one register-register operation is processed per two clock cycles.

In the case where an access to the memory outside the CPU is required at the data operation, the address is outputted from the address output circuit 28 to the outside of the CPU through the external bus interface unit 25 under the control of the microprogram, and the target data is fetched to the data operation unit 24 through the data input/output circuit 27.

In the case where the data operation unit 24 stores data in the memory outside the CPU, the address is outputted from the address output circuit 26 through the external bus interface unit 25, and simultaneously the data is outputted from the data input/output circuit 27. In order to efficiently perform an operand store, the four-byte store buffer is installed in the data operation unit 24.

In the case where the data operation unit 24 obtains a new instruction address by processing a jump instruction or an exceptional processing, this address is outputted to the instruction fetch unit 19 and the PC calculation unit 21.

(2.7) "External Bus Interface Unit"

The external bus interface unit 25 controls communication through the external bus of the microprocessor of the present invention.

All accesses to memories are performed in a clock-synchronized manner, and can be performed in a minimum of two clock cycles. Signals needed for communicating to the exterior bus are inputted/outputted through the control signal input/output circuit 50.

Access requests to memory are generated independently from the instruction fetch unit 19, the address calculation unit 22 and the data operation unit 24. The external bus interface unit 25 arbitrates these memory access requests.

Furthermore, access to data located at misaligned words, i.e., memory address which involve crossing over the word boundary of 32 bits (one word) which is the size of the data bus connecting the memory to the CPU is performed in a manner that crossing over the word boundary is automatically detected in this block and the access is decomposed into memory accesses over two steps. Also, the external bus interface unit 25 controls data access of wider than effective data bus width by dividing into plural accesses with effective exterior data bus width.

This unit 25 also performs conflict preventing processing and by-pass processing from the store operand to the fetch operand in the case where the operand to be pre-fetched and the operand to be stored are superposed.

(3) "Pipeline Processing"

Figure 7:
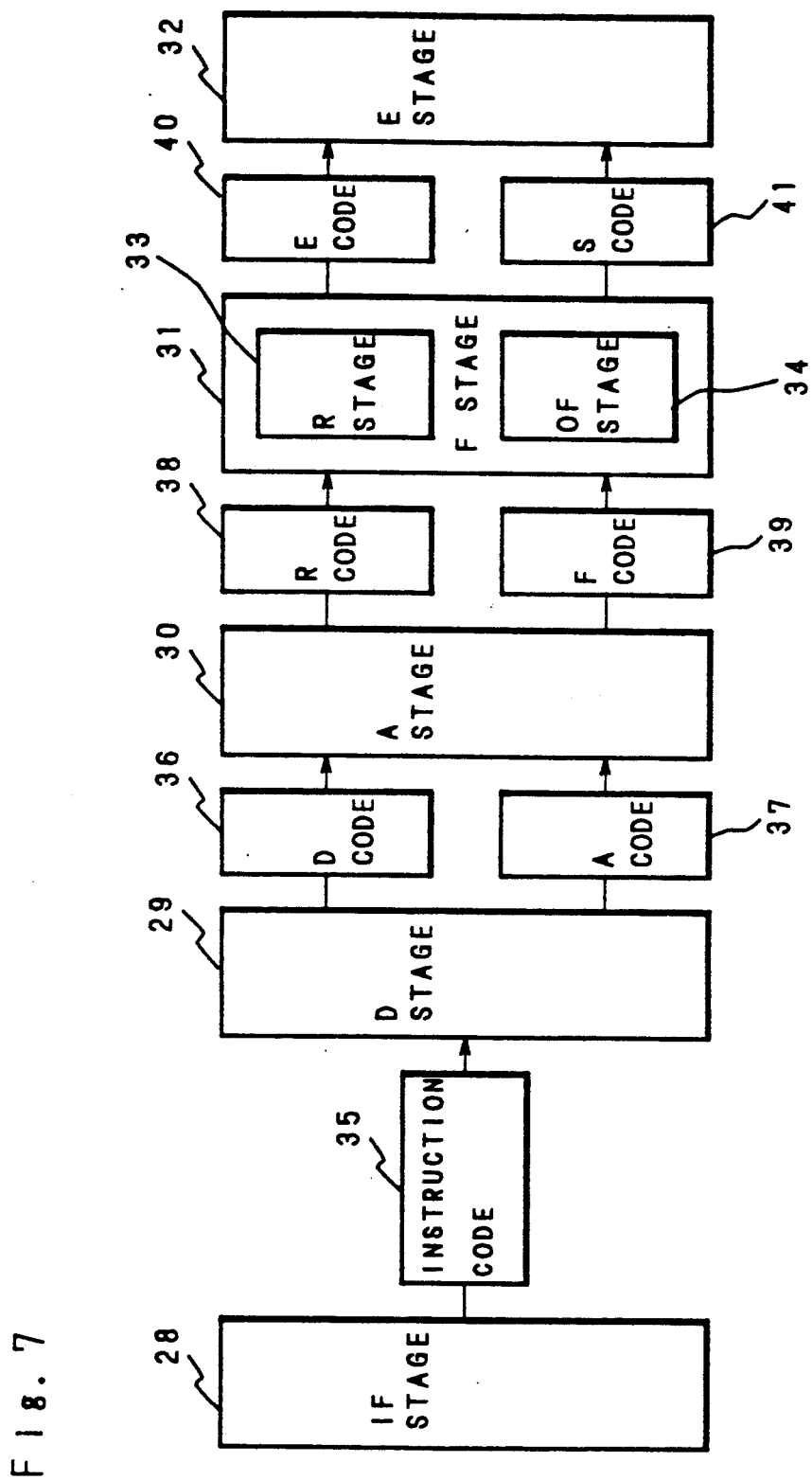
FIG. 7 is a block diagram showing a pipeline configuration of a microprocessor of the present invention.

FIG. 7 is a schematic diagram showing a pipeline processing mechanism of the microprocessor of the present invention.

The basis of pipeline processing has a five-stage configuration which comprises an instruction fetch stage (IF stage) 28 for prefetching an instruction, a decoding stage (D stage) 29 for decoding the instruction, an operand address calculation stage (A stage) 30 for performing address calculation of an operand, an operand fetch stage (F stage) 31 consisting of a portion for performing micro ROM access (particularly called an R stage 33) and a portion for prefetch an operand (particularly called an OF stage 34), and an execution stage (E stage) 32 for executing an instruction.

The E stage 5 comprises a one-stage store buffer, and besides, in some high-function instructions, the execution itself of the instruction is performed in a pipeline manner, and therefore, an actual effect of pipeline processing of five or more stages is obtainable.

Each stage operates independently from the other stages, and theoretically the five stages make perfectly independent operations. Each stage can perform one-time processing in a minimum of two clock cycles. Accordingly, ideally, the pipeline processing progresses one after another on two clocks basis.

The microprocessor of the present invention comprises some instructions which cannot be processed only by the basic pipeline processing of one time such as an operation between memory and memory or a memory indirect addressing, but the microprocessor of the present invention is designed in such a manner that a balanced pipeline processing can be performed whenever possible for processing of these instructions.

For the instruction having a plurality of memory operands, pipeline processing is performed based on the number of memory operands by decomposing it into a plurality of pipeline processing units (step code) at the decoding stage.

Information transferred from the IF stage 28 to the D stage 29 is an instruction code itself. Information transferred from the D stage 29 to the A stage 30 includes two kinds of information, one on operation specified by an instruction (called a D code 36) and the other on address calculation of an operand (called an A code 37).

Information transferred from the A stage 30 to the F stage 31 includes an R code 38 comprising an entry address of a microprogram and a parameter of the microprogram and an F code 39 comprising an operand address and information for memory access.

Information transferred from the F stage 31 to the E stage 32 is an E code 40 comprising operation control information and literal and an S code 41 comprising an operand and its operand address.

EIT detected in the stage other than the E stage 32 does not start the EIT processing until the code thereof reaches the E stage 32. This is because only the instruction processed in the E stage 32 is an instruction at the step of executing, and the instructions having been processed between the IF stage 28 and the F stage 31 do not reach the step of executing yet. Accordingly, for the EIT detected in the stage other than the E stage 32, the detection thereof is recorded in the step code, and it is only transmitted to the following stage.

(4) "Accessing External Devices having Different Data Bus Sizes"

As aforementioned, FIG. 4 is a block diagram showing a schematic configuration of a system, wherein the microprocessor 1 of the present invention having the data bus width of 32 bits (4 bytes) is connected to the ROM 14 having the data bus width of 1 byte (8 bits) and the main memory 17 having the data bus width of 4 bytes (32 bits) by the external data bus 18.

In the following, the operation of the system using the microprocessor of the present invention at booting will be described with reference to FIG. 8 which schematically illustrates the procedures.

As shown in FIG. 8, the microprocessor 1 incorporates a bus size specifying register 12 which specifies a bus size state of the external devices in an external bus interface unit 25, and incorporates a PSW (Processor Status Word) 9 which indicates various operation flags and control flag states related to arithmetic and logical operations, a PC (Program Counter) 11 indicating the instruction address in the program and a stack pointer (SPI) 10 for external interruption in a data operation unit 24. Also, as external terminals connected to a control signal input/output circuit 50, a reset terminal 13 and data bus size specifying terminals 7 and 8 for setting the data width at booting are included.

In the system using the microprocessor of the present invention, a vector table indicating correspondence of the reset interruption vector number to a start address of a processing handler (system initializing program 16 at booting) against the reset interruption is stored in the external ROM 14 beforehand. To one entry 15 of the table, not only the start address (initia) value 15a of PC 11) of the processing handler against the reset interruption, but also an initial value 15b of the stack pointer (SPI) 10 for external interruption is specified.

The microprocessor provided in the integrated circuit device of the present invention, till starting execution of a first instruction after applying the power source or after asserting the reset signal, executes a reset sequence according to the microprogram stored in the micro ROM unit 23. In the reset sequence, the following processings are executed.

Firstly, a vector number corresponding to the reset interruption is generated. Then, the values inputted from the data size specifying terminals 7 and 8 are taken into the bus size specifying register 12.

In the embodiment, the data bus width specified by the input signal to the data size specifying terminals 7 and 8 is set to the size of 1 byte (8 bits) as same as the data bus width of the external ROM 14. Relationship between the input signal to the data size specifying terminals 7 and 8 and the data size of the external ROM 14 is shown in FIG. 9.

Though the output signal of the data size specifying terminals 7 and 8 is set at assembly time of the chip, details to be described later.

Next, the microprocessor 1 accesses address of the external ROM 14 following the vector number above-mentioned, at the data bus width specified by the value of the bus size specifying register 12, and fetches the content of one entry 15 of the table in the external ROM 14. In the entry 15, the start address value (initial value 15a of PC 11) of the program 16 for initializing the system at booting, and the initial value 15b of the stack pointer 10 for external interruption are registered.

The microprocessor 1, according to the fetched content of the entry 15, respectively, sets the start address value of the program 16 for initializing the system at booting in the PC11, and the stack pointer value for external interruption in the SPI10, and at the same time, respectively sets the value of PSW 9 to "0" and an interruption priority mask (IMASK) 9a to a level "0".

According to the start address set in the PC11, the microprocessor 1 reads out the program 16 which initializes the system at booting from the external ROM 14 for execution.

At the end of the system initializing program 16 which is fetched from the external ROM 14 by the microprocessor 1, an LDC instruction which changes the value of the bus size specifying register 12 is programmed. By executing the LDC instruction, the value set in the bus size specifying register 12 is changed from "01" to "11". That is, the data siz of the external ROM 14 is changed from 8 bits to 32 bits which is the data size of the main memory 17.

Figure 10:
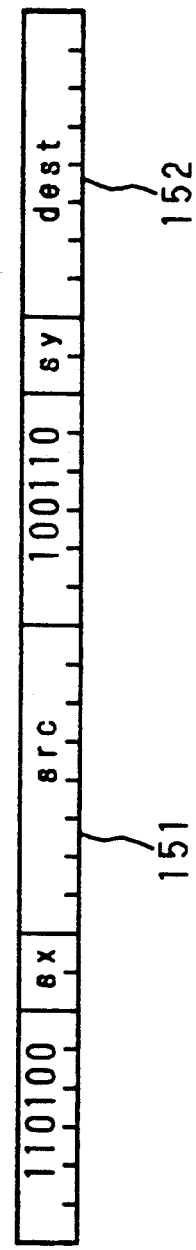
FIG. 10 is a schematic view showing an LDC instruction format.

A format of the LDC instruction format is schematically shown in FIG. 10.

The LDC instruction serves to load the source operand which is specified by the addressing mode of an src bit field 151, onto a control register specified by the addressing mode of a dest bit field 152.

In the microprocessor of the present invention, the following instruction of the LDC instruction is newly fetched, after the value of the bus size specifying register 12 is changed by executing the LDC instruction. Addresses of the external ROM 14 and the main memory 17 are allocated in series, and it is so programmed that the PC value of the following instruction of the LDC instruction becomes the address on the main memory 17. Therefore, the following instruction of the LDC instruction is fetched from the main memory 17.

In such a manner, after finishing a boot trap, an accessing destination of the microprocessor 1 is switched to the main memory 17 from the external ROM 14, and simultaneously, the data bus width is changed.

In the following, setting of the input signal to the data size specifying terminals 7 and 8 will be described.

Signals of the data size specifying terminals 7 and 8 are not inputted from the exterior, but when assembling the semiconductor chip of the integrated circuit device of the present invention provided with the microprocessor of the invention in a package, pads of the data size specifying terminals 7 and 8 are connected to either of power lead 5Vcc or ground lead 5GND on the package side by means of bonding wires 4. Relationship between the connecting state and the data size specified thereby is as shown in FIG. 9.

(6) "Package Construction"

Schematic views of detailed wiring of a package of the integrated circuit device of the present invention are shown in FIG. 11 through FIG. 15. Where, as the package, a chip is packaged in a pin-grid alley (PGA) so as to be able to select the power source and ground freely at assembly time.

Figure 11:
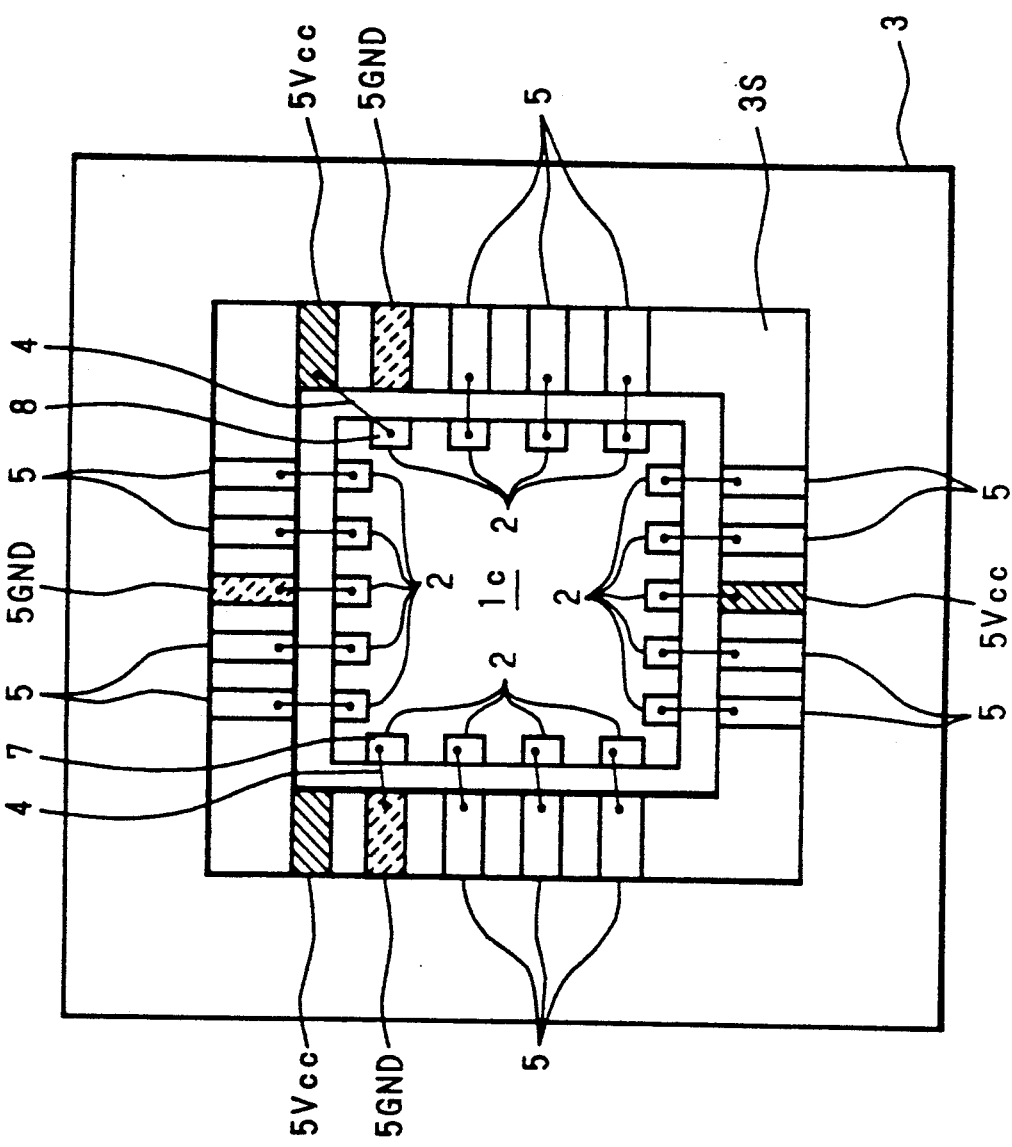
FIG. 11 is a schematic plan view showing a configuration of an integrated circuit device of the present invention, and showing a connecting state of a data size identifying pad at assembly time.

FIG. 11 is a schematic plan view showing a configuration of the integrated circuit device of the present invention.

In FIG. 11, numeral 3 designates a package whose center portion is opened and provided with a semiconductor chip 1c.

In the package 3, as to be described later, a signal ine layer 3S, a power layer 3Vcc and a ground layer 3GND are respectively laminated in top, intermediate and bottom layers.

Around the semiconductor chip 1c, a plurality of pads 2 are arranged. In the embodiment, two pads out of these plural ads 2 are used as the data size specifying terminals 7 and 8.

In the opening of the package 3, the signal line layer 3S of the top is exposed. Around the opening of the signal line layer 3S, a plurality of leads 6 are arranged. In these plural leads 5, these are provided power leads 5Vcc for supplying a power potential to the semiconductor chip 1c, ground leads 5GND for supplying a ground potential and leads 5 for transmitting the usual signals.

By respectively connecting, among these leads 5, one power lead 5Vcc and the data size specifying terminal 7 (or 8), and one ground lead 5GND and the data size specifying terminal 8 (or 7) at assembly time, the signals as shown in FIG. 9 are inputted to the data size specifying terminals 7 and 8.

Figure 12:
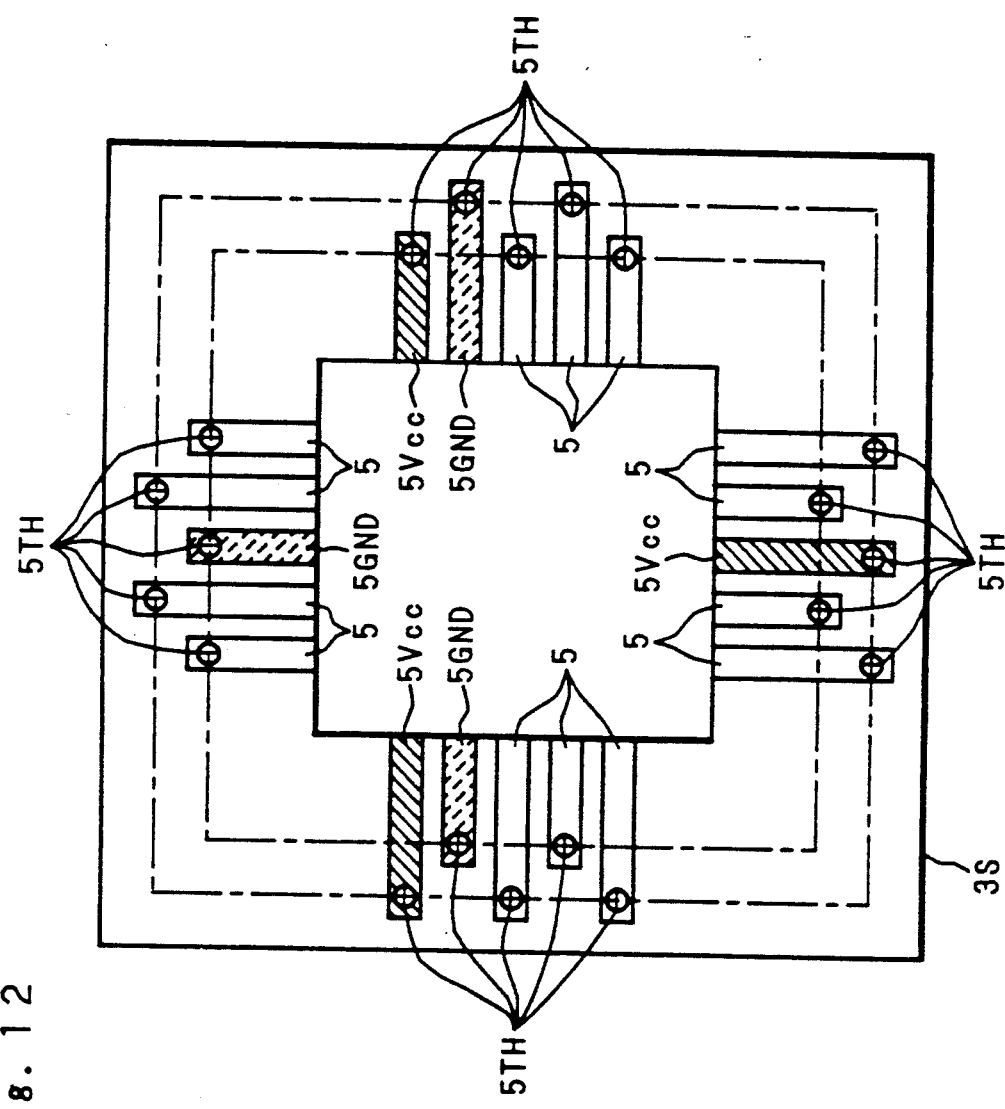
FIG. 12 is a schematic plan view of a signal line layer of a package.

FIG. 12 is a schematic plan view of the top signal line layer 3S. The top signal line layer 3S is the layer to which the bonding wires 4 are connected. One ends of respective leads 5 of the signal line layer 3S are connected to the bonding wires 4, and the other ends are connected to through-hole wirings 5TH extending to the lower power layer 3Vcc and the ground layer 3GND.

Figure 13:
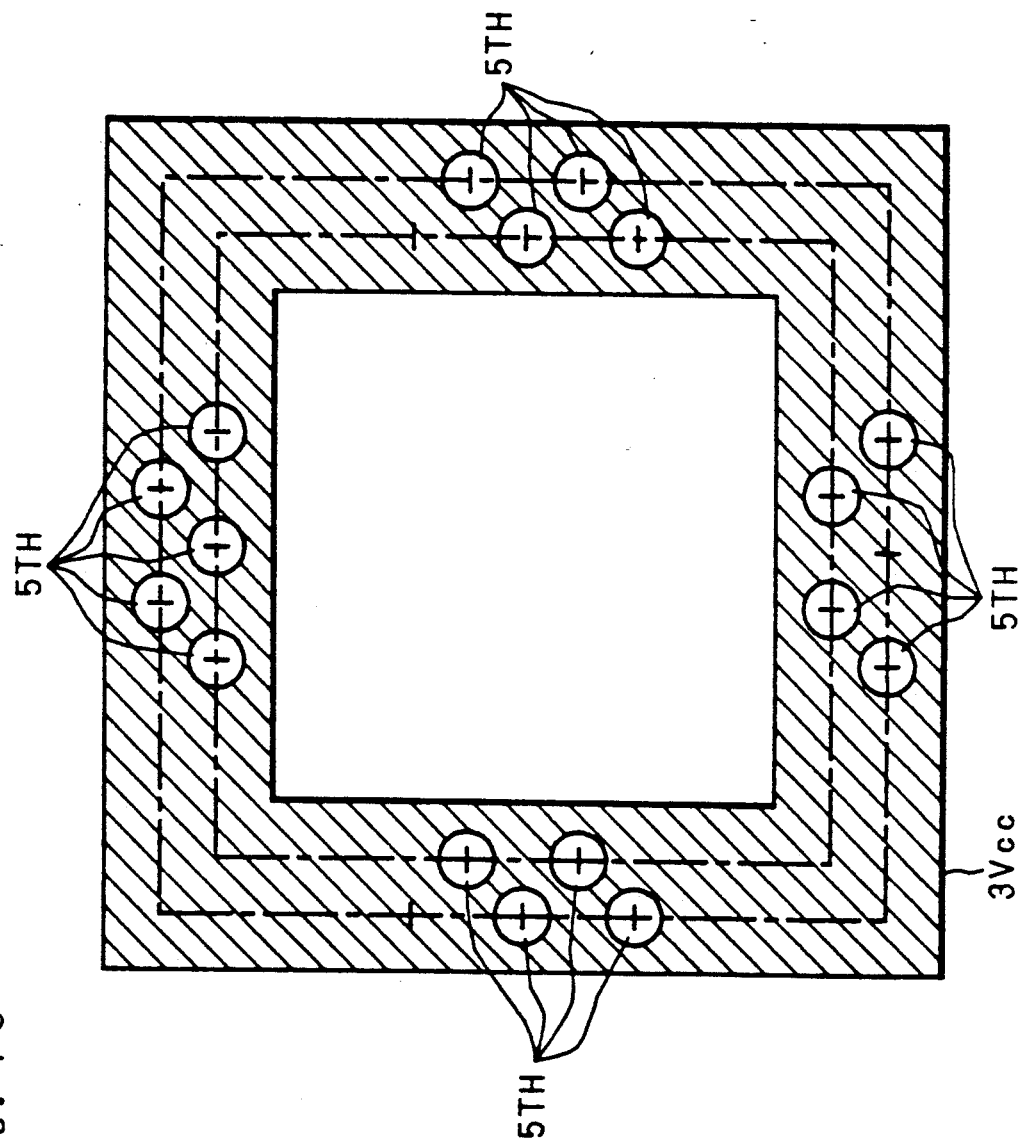
FIG. 13 is a schematic plan view of a power layer of a package.

FIG. 13 is a schematic plan view of the power layer 3Vcc.

The through-hole wirings 6TH connected to the power leads 5Vcc of the signal line layer 3S are connected to the power layer 3Vcc, and the other through-hole wirings 5TH connected to the signal leads 6 and the ground leads 5GND are extended through the power layer 3Vcc. From the power layer 3Vcc, a power wiring to a power pin 6Vcc to be described later is extended to the bottom ground layer 3GND side.

Figure 14:
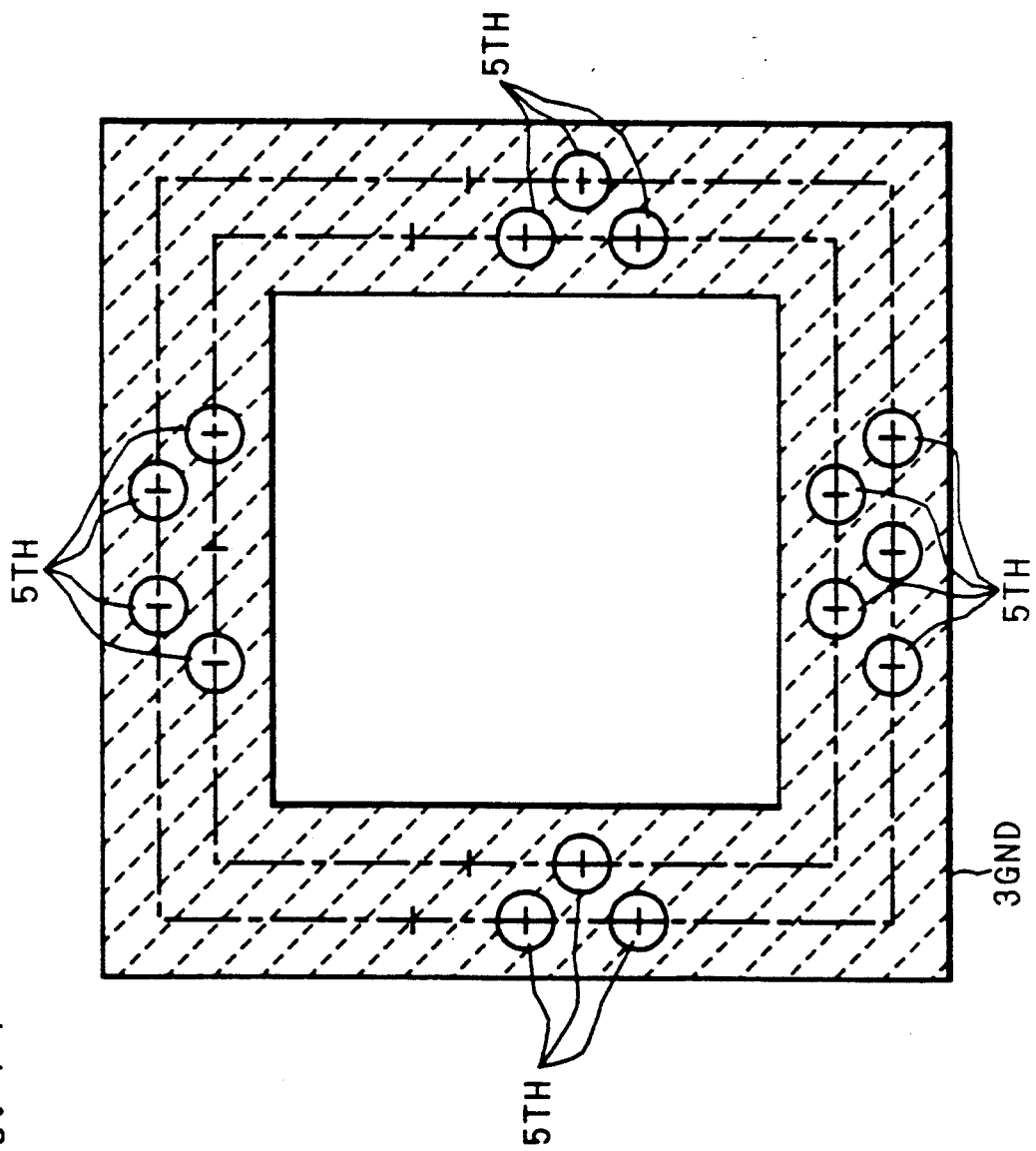
FIG. 14 is a schematic plan view of a ground layer of a package.

FIG. 14 is a schematic plan view of the ground layer 3GND.

The through-hole wirings 5TH connected to the ground leads 5GND of the signal line layer 3S are connected to the ground layer 3GND, and the other through-hole wirings 5TH connected to the signal leads 5 are extended through the ground layer 3GND. A power wiring connected to the external power pin 6Vcc from the power layer 3Vcc is extended through the ground layer 3GND. A ground wiring connected to a ground pin 6GND from the ground layer 3GND is extended through the lower layer side.

Figure 15:
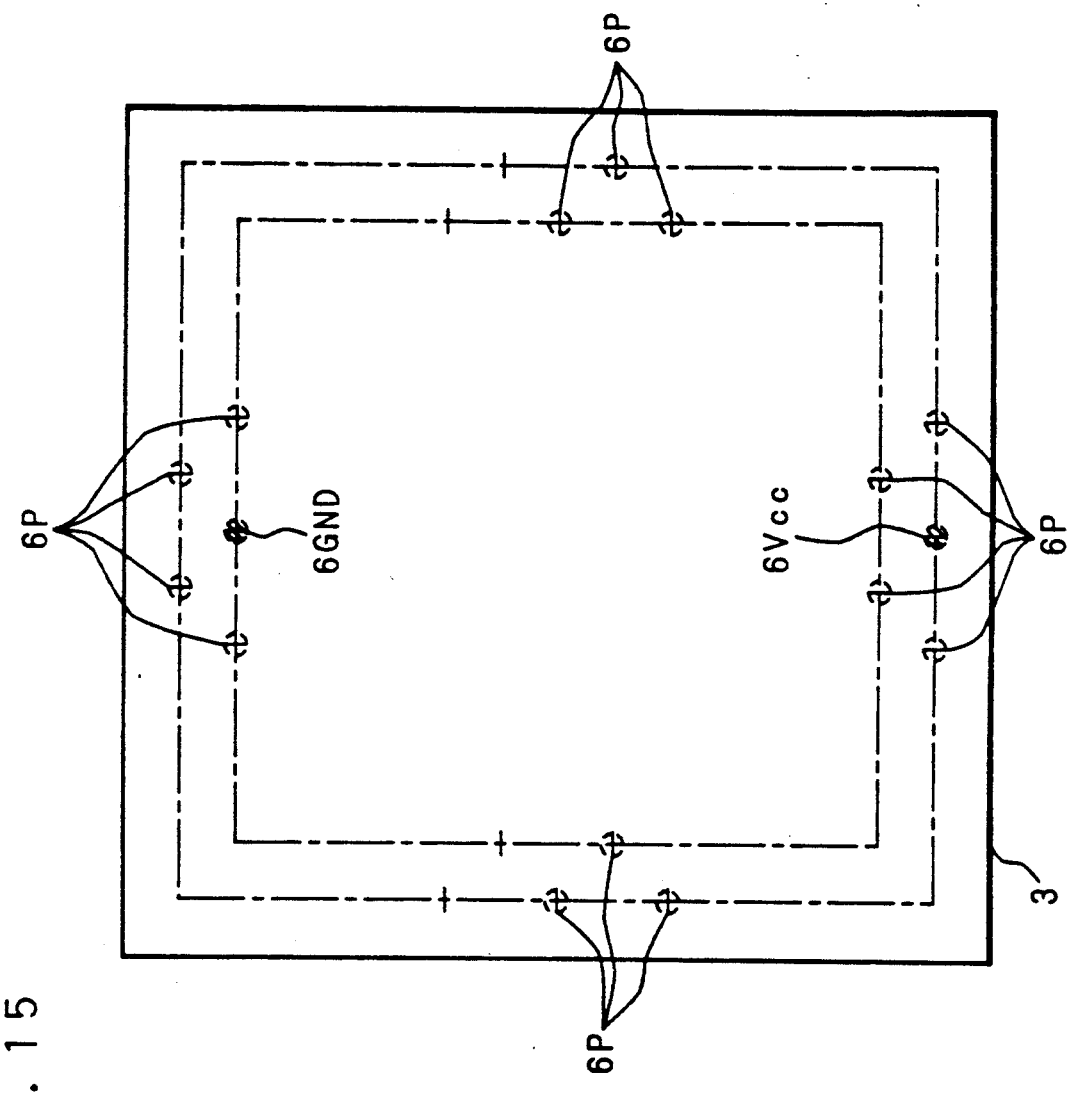
FIG. 15 is a schematic plan view showing the pin arrangement of a package.

FIG. 15 is a schematic plan view showing the arrangement of external pins of the integrated circuit device of the present invention.

The through-hole wirings 5TH passing through the power layer 3Vcc and the ground layer 3GND from the signal line layer 3S are connected direct to external pins 6P for signal. The power wiring passed through the ground layer 3GND and wired to the lower layer from the power layer 3Vcc is connected to the power pin 8Vcc, and the ground wiring extended to the lower layer from the ground layer 3GND is connected to the ground pin 6GND.

As described above, in the present invention, since it is so constructed that, at booting, while the system initializing program 16 is fetched from the external ROM 14 to the microprocessor 1, the data size of the external ROM 14 is set in the bus size specifying register 12, the exterior circuits are not necessary as in the prior art, and also the data size specifying terminals 7 and 8 are connected to the power potential or ground potential at assembly time of the chip to initialize the data size, so that the number of external pins of the integrated circuit device can be reduced.

(6) "Other embodiment"

In the aforesaid embodiment, though an example of interated circuit device, in which the initial set value to the register controlling the size of the data bus width is performed by wire blonding at assembly time, has been described, not only control of the data bus width, but also control of the PSW interruption mask value or the vector number at resetting is also possible.

Here, a configuration for initializing the interruption mask value of the PSW is described in the following as a second embodiment.

As shown in FIG. 8, the microprocessor 1 incorporates the PSW 9 indicating the state of various operation flags and control flags related to arithmetic and logical operations, the PC11 indicating the instruction address in the program and the stack pointer (SPI) 10 for external interruption in a data operation unit 24.

Also, as external terminals connected to the control signal input/output circuit 50, a reset terminal 13, interruption mask level specifying terminals 7a, 7b, 7c and 7d for setting the interruption mask level at booting, external interruption (IRL0: 2) terminals 8a, 8b and 8c and an external interruption accepting (IACK) terminal 9b are prepared. In the PSW9, specific 4 bits are set as an interruption mask level specifying field (IMASK) 9a.

In the microprocessor 1, as an external interruption priority seven levels are set beforehand.

The interruption request level is specified as shown in FIG. 16 by inputting the signal "1" or "0" respectively to the IRL0: 2 terminals 8a, 8b and 8c. The signal inputted from the IRL0: 2 terminals 8a, 8b and 8c is compared with the value set in the IMASK 9a at that time point. As the result of comparison, in the case where the interruption having a higher priority than the level set in the IMASK 9a is requested, the IACK terminal 9b is asserted and acceptance of the interruption request is notified to the exterior.

As same as the integrated circuit device of the first embodiment, also in the second embodiment, a vector table showing correspondence of the start address of a processing handler (program 16 for initializing the system at booting) against the reset interruption, to the reset interruption vector number is stored in the external ROM 14 in advance. In one entry 15 of the table, not only the start address (initial value 15a of PC 11) of the processing handler, but also the initial value 15b of the stack pointer (SPI) 10 for external interruption is specified.

The microprocessor provided in the integrated circuit device of the second embodiment executes a reset sequence according to the microprogram stored in the micro ROM unit 23, till starting execution of a first instruction after applying the power source or after asserting the reset signal. In the reset sequence, the following processings are executed.

Firstly, the vector number corresponding to the reset interruption is generated. Then, the values inputted from the interruption mask level specifying terminals 7a, 7b, 7c and 7d are taken into the interruption mask level specifying field (IMASK) 9a of the PSW 9. At this time, the other fields of the PSW9 are all "0".

In the second embodiment, by connecting the interruption mask level specifying terminals 7a, 7b, 7c and 7d respectively to GND, GND, Vcc, GND (Vcc represents the power potential and GND represents the ground potential) in order to bring the input signal to the IMASK 9a to "0010", till fetching the first instruction after resetting, the interrupt request up to the priority level 2 is masked.

Relationship between the input signals to the interruption mask level specifying terminals 7a, 7b, 7c and 7d and the interruption level being masked is as shown in FIG. 17.

Figure 18:
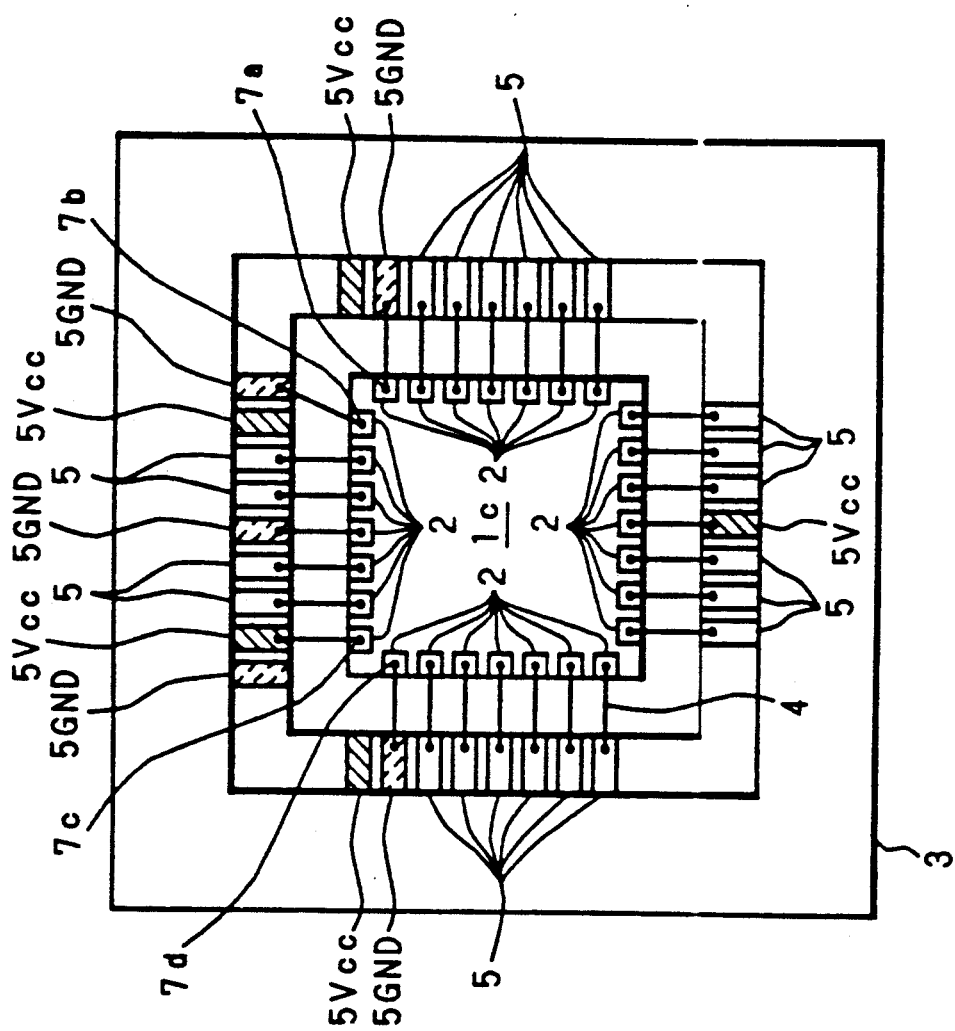
FIG. 18 is a schematic plan view showing a configuration of a second embodiment of an integrated circuit device of the present invention, and showing a connecting state of an interruption mask level specifying pad at assembly time.

FIG. 18 is a schematic plan view of the integrated circuit device showing the state of wiring for setting input signals to respective interruption mask level specifying terminals 7a, 7b, 7c and 7d at assembly time.

Next, the microprocessor 1 accesses the address of the external ROM 14 following the aforesaid vector number, and fetches the content of one entry 15 of the table in the external ROM 14. In the entry 15, the start address value (initial value 15a of PC 11) of the program 16 for initializing the system at booting, and the initial value 15b of the stack pointer 10 for external interruption are registered.

The microprocessor 1, according to the fetched content of the entry 15, respectively, sets the start address value of the program 16 for initializing the system at booting in the PC 11, and the stack pointer value for external interruption in the SPI 10.

According to the start address set in the PC11, the microprocessor 1 reads out the program 16 for initializing the system at booting from the external ROM 14 for execution.

During execution of the program 16 for initializing the system, the interruption up to the level 2 is masked by the set value of the IMASK 9a. Therefore, when the interruptions of the levels 2 to 6 ("010" to "110") are requested from the IRL0:2 terminals 8a, 8b and 8c this interruption request is not accepted, and the output of the IACK terminal 9b is negated. Accordingly, the microprocessor 1 continues to execute the program 16 for initializing the system.

At the end of the program 16 for initializing the system, the LDC instruction which changes the interruption mask level value is programmed. By executing the LDC instruction, a value set in the IMASK 9a is changed to the value of except "0010". That is, after executing the program 16 for initializing the system, the interruption mask level is changed.

While, when the interruption of the level 0 or 1 ("000" or "001") is requested by the input signal to the IRL0: 2 terminals 8a, 8b and 8c, during executing the program 16 for initializing the system, the interruption is accepted and the output of the IACK terminal 9b is asserted.

Thereby, the program 16 for initializing the system being executed by the microprocessor 1 is interrupted, and processings are moved to the processing handler corresponding to the interruption level 0 or 1.

As aforementioned, in the second embodiment, the mask level of the interruption requested till fetching the first instruction after resetting, can be optionally specified by the input signal to the external interruption mask level specifying terminal.

As particularly described heretofore, in the integrated circuit device and the microprocessor using the same of the present invention, by connecting pads of the semiconductor chip to either the power lead or the ground lead of the package at assembly time of the integrated circuit device, plural kinds of initial states can be set by one kind of chip. Leads used for the initialization are connected to the power source or ground in the package, so that the external pins of the package are not increased.

Also, in the microprocessor of the present invention, by providing a bus size control register controlling the data bus width used at external accessing, by changing its content by a predetermined instruction, the external devices having different data bus widths are accessible.

Furthermore, in the microprocessor of the present invention, by deciding the initial value of the bus size control register with a wire bonding at assembly time of the integrated circuit device, the data bus width of the external ROM storing the system initializing program can be set at booting. As industrial standard sizes of the device used in the external ROM, the data bus width is often decided below one byte. Therefore, when the system has only a function to access the ROM with the data bus width of 4 bytes at booting, conventionally four ROMs were necessary. However, in the present invention, the program for initializing the system mostly has less than one tenth of a storing capacity of one ROM, therefore, in a microprocessor system using the microprocessor of the present invention, only one ROM is sufficient for the program for initializing the system.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims: or equivalence of such metes and bounds thereof are therefore intended to be embraced by the claims.

What is claimed is:

1. An integrated circuit device which is constructed by sealing a semiconductor chip being able to be initialized in plural initial states in a package,
    wherein said package is constituted separately from said semiconductor chip and has a plurality of lead wires onto which a first potential and a second potential are applied, and
    said semiconductor chip has signal pads for electrically connecting itself and one of said plurality of lead wires of said package, and is initialized in any one of the plural initial states corresponding to connecting states of said signal pads and said plurality of lead wires when said semiconductor chip is sealed in said package.

2. The integrated circuit device of claim 1, wherein said package includes a first layer being coupled to lead wires onto which said first potential is applied, and a second layer being coupled to lead wires onto which said second potential is applied, said first and second layers being laminated in said package.

3. The integrated circuit device of claim 2, wherein said package includes a third layer onto which said plurality of lead wires is disposed to facilitate electrical connection with the signal pads of said semiconductor chip, said third layer being laminated in said package.

4. The integrated circuit device of claim 3, wherein said package includes additional lead wires for transmitting signals to and from said semiconductor chip, said additional lead wires being disposed on said third layer to facilitate electrical connection with the signal pads of said semiconductor chip.

5. The integrated circuit device of claim 4, wherein said semiconductor chip is initialized in any one of the plural initial states corresponding to connecting states of two signal pads and four lead wires.

6. The integrated circuit device of claim 5, wherein the plural initial states of said semiconductor chip correspond to various data bus widths of said chip.

7. The integrated circuit device which is constructed by sealing a semiconductor chip being able to be initialized in plural initial states in a package,
    wherein said package is constituted separately from said semiconductor chip, and wherein a first layer being coupled to lead wires onto which a first potential is applied, and a second layer being coupled to lead wires onto which a second potential is applied are laminated in said package, and
    said semiconductor chip has signal pads for electrically connecting itself and said lead wires coupled to said first layer and said second layer of said package, and is initialized in any one of the plural initial states corresponding to connecting states of said signal pads and said lead wires.

8. The integrated circuit device of claim 7, wherein said package includes a third layer onto which said lead wires coupled to said first layer and said second layer of said package are disposed to facilitate electrical connection with the signal pads of said semiconductor chip, said third layer being laminated in said package.

9. The integrated circuit device of claim 8, wherein said package includes additional lead wires for transmitting signals to and from said semiconductor chip, said additional lead wires being disposed on said third layer to facilitate electrical connection with the signal pads of said semiconductor chip.

10. The integrated circuit device of claim 9, wherein said semiconductor chip is initialized in any one of the plural initial states corresponding to connecting states of two signal pads and four lead wires.

11. The integrated circuit device of claim 10, wherein the plural initial states of said semiconductor chip correspond to various data bus widths of said chip.

12. A microprocessor comprising
    an integrated circuit device which is constructed by sealing a semiconductor chip which is capable of being initialized in any one of a plurality of initial states in a package,
    wherein said package is constituted separately from said semiconductor chip and has a plurality of lead wires onto which a first potential and a second potential are applied; and
    said semiconductor chip is provided with signal pads for electrically connecting itself and said plurality of lead wires of said package, an instruction decoding circuit for decoding instructions, an instruction executing circuit for executing the instructions, and a control circuit which is initialized in any one of the plural initial states at resetting of said semiconductor chip corresponding to connecting states of said signal pads and said plurality of lead wires when said semiconductor chip is sealed in said package.

13. A microprocessor as set forth in claim 12, wherein a first layer being coupled to lead wires onto which said first potential is applied, and a second layer being coupled to lead wires onto which said second potential is applied are laminated in said package.

14. A microprocessor which executes one or more instructions and can be reset to an initial state, comprising
    an integrated circuit device which is constructed by sealing a semiconductor chip in a package;
    a data bus which inputs and outputs data to and from the exterior of said package;
    data bus width control value storing means for selecting an effective bit width of said data bus;
    signal pads into which signals for deciding the initial value of said data bus width control value storing means are inputted from the exterior;
    an instruction decoding circuit for decoding the instructions;
    a control circuit for setting the value inputted from said signal pads in said data bus width control value storing means at reset time; and
    an instruction executing circuit which inputs and outputs data to and from the exterior, through said data bus with the data bus width decided by the set value in said data bus width control value storing means, when the instructions decoded in said instruction decoding circuit are executed after resetting.

15. A microprocessor as set forth in claim 14, wherein a layer provided with signal lead wires connected to said data bus, and a layer provided with lead wires to which said signal pads are connected are laminated in said package.

16. A microprocessor which executes one or more instructions and can be reset to an initial state comprising an integrated circuit device which is constructed by sealing a semiconductor chip in a package;

a data bus which inputs instructions from the exterior of said package;

data bus width control value storing means for selecting an effective bit width of said data bus;

an instruction fetch circuit which inputs the instructions from the exterior through said data bus;

an instruction executing circuit for executing the instructions; and a control circuit for controlling execution of the instructions according to the output of said instruction decoding circuit;

whereby when the data bus width change instruction is inputted through said data bus at the effective bit width decided by the set value in said data bus width control value storing means, the data bus width change instruction is decoded by said instruction decoding circuit and executed by said instruction executing circuit, to newly set the value in said data bus width control value storing means, and the instruction to be executed is inputted successively to said data bus width change instruction, through said data bus at the effective bit width decided by the set content.

17. A microprocessor as set forth in claim 16, wherein a plurality of layers including the layer being provided with the signal lead wires connected to said data bus are laminated in said package.

18. An apparatus for selectively setting an initial state in a semiconductor chip residing in a package, the semiconductor chip comprising a conductive pad disposed on a surface of the chip, the apparatus comprising a signal line layer within the package comprising a non-conducting surface, the surface having an opening large enough to allow the chip to reside within the edges of the opening;

a group of two or more conductive leads disposed along the edges of the opening, wherein each lead in the group is at a different voltage level and is positioned substantially near to the pad such that a bonding wire may be directly connected from the pad to each lead in the group without contacting any other conductive surface;

a bonding wire directly connected between the pad and one of the leads in the group, the bonding wire applying the voltage from the lead to the pad;

detection means within the chip coupled to the pad for detecting the voltage applied by the bonding wire from the lead to the pad; and selection means within the chip coupled to the detection means for selectively setting one of a plurality of initial states within the chip in response to the detected voltage.

19. The apparatus of claim 18, further comprising two or more conductive pins protruding from the package;

two or more pads on the chip; and a number of groups of conductive leads, wherein each pad has a unique associated group, each lead within a group being at a different voltage from other leads within the group, a lead within a given group associated with a given pad being positioned substantially near to the given pad such that a bonding wire may be directly connected from the given pad to each lead in the given group without contacting any other conductive surface;

one or more common conductors within the package, leads at the same voltage being connected to the same common conductor, wherein each common conductor is electrically coupled to one of the pins;

a bonding wire directly connected between each pad and one of the leads in the group associated with the pad, the bonding wires applying the voltage from the leads to the pads;

detection means within the chip coupled to the pads for detecting the voltage applied by the bonding wires from the leads to the pads; and selection means within the chip coupled to the detection means for selectively setting one of a plurality of initial states within the chip in response to the detected voltages.

20. The apparatus of claim 19, wherein a lead may belong to two or more groups.

* * * * *